United States Patent [19]
Hietala et al.

[11] Patent Number: 5,389,837
[45] Date of Patent: Feb. 14, 1995

[54] SUPERCONDUCTING FLUX FLOW DIGITAL CIRCUITS

[75] Inventors: Vincent M. Hietala, Placitas, N. Mex.; Jon S. Martens, Sunnyvale, Calif.; Thomas E. Zipperian, Albuquerque, N. Mex.

[73] Assignee: The United States of America as represented by the United States Department of Energy, Washington, D.C.

[21] Appl. No.: 51,103

[22] Filed: Apr. 21, 1993

[51] Int. Cl.$^6$ .......................................... H03K 19/195
[52] U.S. Cl. .......................................... 326/3; 505/701; 326/6; 327/186
[58] Field of Search ............... 307/462, 476, 245, 277, 307/272.2, 306; 257/34; 505/701

[56] References Cited

U.S. PATENT DOCUMENTS

| | | |
|---|---|---|
| 4,330,841 | 5/1982 | Yamada et al. ............ 307/476 X |
| 4,623,804 | 11/1986 | Goto ............................ 307/476 |
| 5,019,721 | 5/1991 | Martens et al. . |
| 5,070,070 | 12/1991 | Askew et al. ............... 307/306 X |
| 5,109,164 | 4/1992 | Matsui ........................ 307/306 |
| 5,229,655 | 7/1993 | Martens et al. ............. 307/245 X |
| 5,286,710 | 2/1994 | Hascicek et al. ........... 307/245 X |

Primary Examiner—David R. Hudspeth
Attorney, Agent, or Firm—Gregory A. Cone

[57] ABSTRACT

A NOR/inverter logic gate circuit and a flip flop circuit implemented with superconducting flux flow transistors (SFFTs). Both circuits comprise two SFFTs with feedback lines. They have extremely low power dissipation, very high switching speeds, and the ability to interface between Josephson junction superconductor circuits and conventional microelectronics.

9 Claims, 8 Drawing Sheets

SUPERCONDUCTING FLUX FLOW DIGITAL CIRCUITS

The government has rights to this invention pursuant to Contract No. DE-AC04-76DP00789 awarded by the Department of Energy.

BACKGROUND OF THE INVENTION

This invention relates to digital logic circuits implemented with flux flow transistors made from high temperature superconducting materials.

There are at least two other superconducting technologies that can be used for logic circuits. Modified Variable Threshold Logic (MVTL) and Single Flux Quantum (SFQ) are both based on small Josephson junctions. MVTL uses hysteretic Josephson junctions in a latching mode. While on the same order of speed as the flux flow logic circuits disclosed in this application, they have difficulty in interfacing directly to conventional electronics. The MVTL technology is explained in the reference by S. Hasuo, S. Kotani, A. Inoue and N. Fujimaki, "High Speed Josephson Processor Technology" IEEE Trans. on Mag. MAG-27, 2602 (1991). SFQ uses non-hysteretic junctions and circuit topologies that operate on individual vortices. This family is faster than flux flow logic, but certain combinational functions are more difficult to implement. Additionally, they suffer from noise immunity and cross-talk problems and have difficulty in interfacing to conventional electronics. The SFQ logic is explained in the reference by K. K. Likharev and V. K. Semenov, "RSFQ Logic/Memory Family: A New Josephson-Junction Technology for Sub-Terahertz-Clock-Frequency Digital Systems" IEEE Trans. on Appl. Supercond. 1, 3 (1991). Memories have also been difficult to implement in these two technologies because of standby power dissipation and coupling problems.

The flux flow logic described herein has important advantages. The flux flow flip flop and inverter have very low power dissipation in all static states, and the devices can couple trivially to each other and to conventional circuitry. Compared to conventional logic circuits, generally FET-based, the flux flow circuits have major advantages in power dissipation (by orders of magnitude) and speed. For the same linewidth lithography, it is estimated that flux flow logic is more than an order of magnitude faster than GaAs-based FET logic. Because the flux flow signal levels are reasonable, they can couple effectively to conventional circuitry. The basic operation of the SFFT is set forth in U.S. Pat. No. 5,019,721 for "Active Superconducting Devices Formed of Thin Films" issued on May 28, 1991 to J. S. Martens et al. This patent is incorporated by reference in its entirety.

SUMMARY OF THE INVENTION

Superconducting flux flow transistors (SFFTs) are high speed devices that can operate a temperatures of 100K or higher, depending on the materials used. These devices are based on magnetic control of flux flow through a series of weak links. The weak links are an intermediate region of reduced dimensions that separates the main conducting body of the SFFT into first and second regions. The first region is connected to an external current source of bias current. The second region is connected to an output line. A bias current is applied to the first region of the body and then on through the links to induce flux motion in the links, locally exceeding the critical field $H_{cl}$. An adjacent control current line provides a local magnetic field which can alter the flux density in the links and the resulting voltage output from the device. If no current passes through the control current line, the main conducting body will remain in a superconducting mode with no voltage drop across the device. If sufficient current passes through the control current line, additional magnetic flux will interact with the current in the weak links and cause the links to become resistive, thereby creating a voltage drop across the main body.

The current/voltage characteristic of these devices, as compared to conventional semiconductor transistors, does not have the two well-defined states required for logic operations. This invention discloses a family of circuits based on two SFFTs with appropriate control lines and feedback to define a NOR/inverter gate and also a flip flop with two well defined logic states. The states are defined by which path, that is which SFFT, the bias current flows through. Because of the feedback, essentially all of the bias current will flow entirely through one or the other of the SFFTs.

For the NOR/inverter gate, the main body of each of the two SFFTs is connected on one side to an external bias current source. The first of the SFFTs has its weak links proximate to at least one control current signal line. The output line from the first SFFT has a portion which is proximate to the weak links of the second SFFT. The logic output of the NOR/inverter is the current state on the output line from the first SFFT. One or more high logic states, that is the presence of sufficient current to cause the weak links to go resistive, on the control current lines next to the weak links in the first SFFT will shut off current flow through it. This will cause the bias current to flow through the second SFFT to its output, thus maintaining a constant current with no appreciable voltage across the device (low power dissipation). Since no current comes out of the first SFFT, the initial high logic input is reversed to a low logic output state thereby acting as an inverter for a single input or a NOR gate for multiple inputs. This output can be conveyed to other logic gates or to a buffer.

For sequential logic a storage element is needed. Although two of the above NOR/inverter gates could be used as a flip flop, we instead modified the two SFFT NOR/inverter gate to provide a much simplified version of the flip flop. Here the bias current input line to the second SFFT is routed so as to be adjacent to the weak links in the first SFFT, and a separate control current line is provided to the weak links of the second SFFT. Hence, if the input control current line to the first SFFT is high and the input control current line to the second SFFT is low, the bias current will flow through the second SFFT to establish a high logic state at its output. Similarly, if the control line to the second SFFT is high and the control line to first SFFT is low, the first SFFT will conduct the bias current resulting in a high logic state at its output. The feedback is high enough that a pulse on an input control line will cause the flip flop circuit to latch. If both inputs are low, the flip flop remains in its present state.

DETAILED DESCRIPTION OF THE INVENTION

The digital logic circuits of this invention are based on superconducting flux flow transistors that show high speed, reasonable signal levels, large fan-out and large noise margins. These circuits have been shown to operate at over 90K. The NOR/invertor gates have been demonstrated with fan-outs of more than 5 and fully loaded switching times less than a fixture-limited 50 ps. Flip flops have also been demonstrated showing large noise margins, response times less than 30 ps and static power dissipation on the order of 30 nW. Among other uses, these circuits can serve as an interface between logic families such as single flux quantum (Josephson-based, low impedance levels, current based) and conventional semiconductor logic (higher impedance levels and larger signals).

Figure 1:
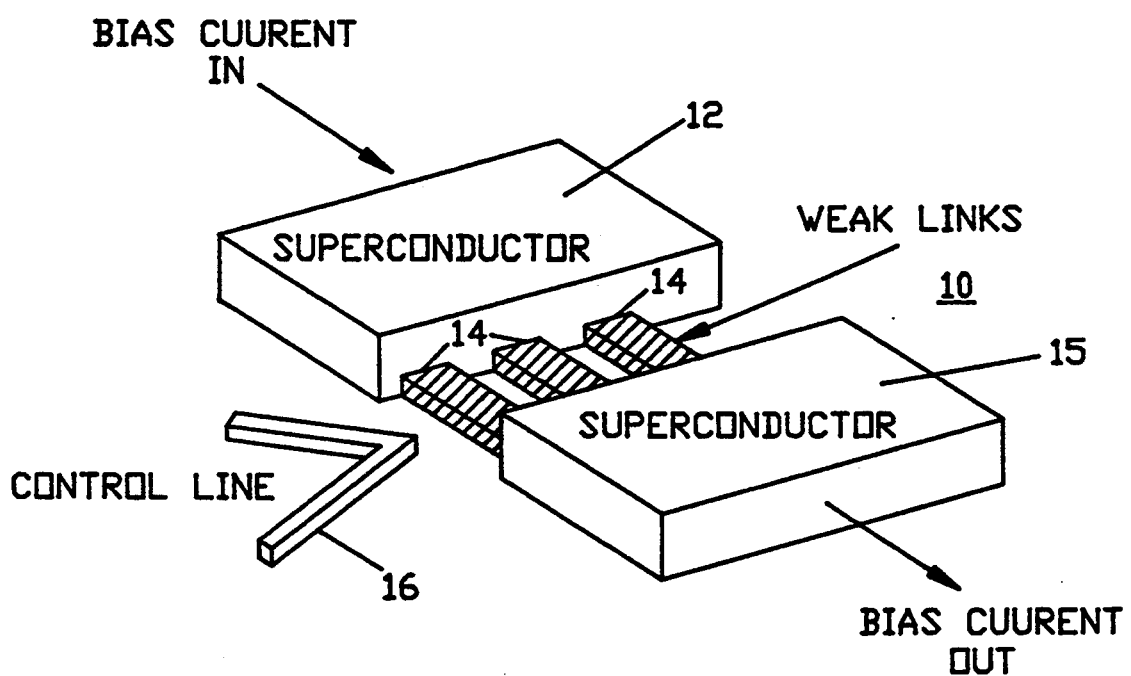
FIG. 1 is an isometric view of the elements of a superconducting flux flow transistor.

FIG. 1 is a representation of an SFFT 10. It is based on the magnetic control of flux flow through a series of weak links 14. A bias current is applied to first superconducting region 12 and into the links 14 to induce flux motion which locally exceeds the critical field. An adjacent control current line 16 provides a local magnetic field when a control signal current passes through it. The control line may be on the same film level as the weak links or may be suspended above them. Another control line could be located on the opposite side of the weak links 14. Multiple control lines can also be used where some lines are on different metallization levels or are arranged in a tight configuration around the first link. The field from line 16 alters the flux density in the links and hence the terminal characteristics. The base film, from which the transistors are fabricated, can be either YBaCuO or TlCaBaCuO and is typically 200-300 nm thick. The links are thinned to 10-50 nm to promote flux flow and are 2-3 $\mu$m wide and about 6 $\mu$m long. Specifically, they are about 2 $\mu$m wide for the flip flop and about 3 $\mu$m for the NOR/invertor gate. These dimensions are for the initial embodiments of these circuits, and it can be expected that they will diminish as process improvements are made since the flux flow physics is not expected fundamentally change until the links are much smaller. Smaller dimensions are desirable because they reduce circuit area and device transit time and thus switching speed.

Figure 2:
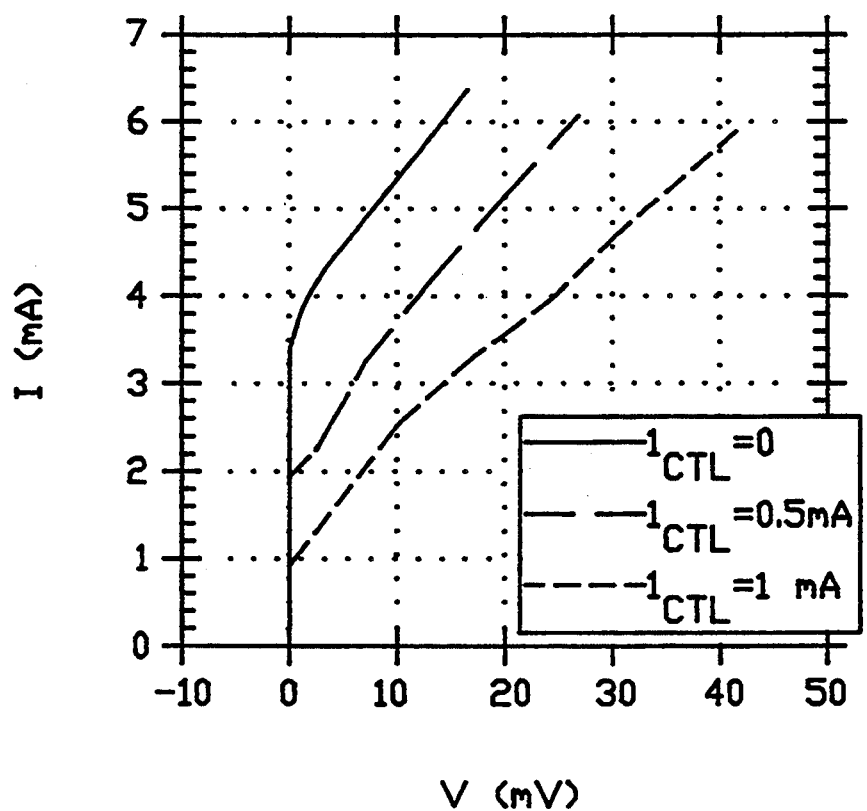
FIG. 2 is a graph showing IV curves for a TlCaBaCuO SFFT at three different control current levels.

FIG. 2 is a current-voltage curve for a single SFFT. At low drive currents the links are fully superconducting. Above the critical current, flux motion begins inducing a finite resistance. An increase in control current increases the amount of flux in the system and hence increases the terminal voltage. At sufficiently high current drives, the entire link system goes normal, and a simple resistive branch results. This region of operation is normally avoided because it is thermally dominated and therefore slow.

Figure 3:
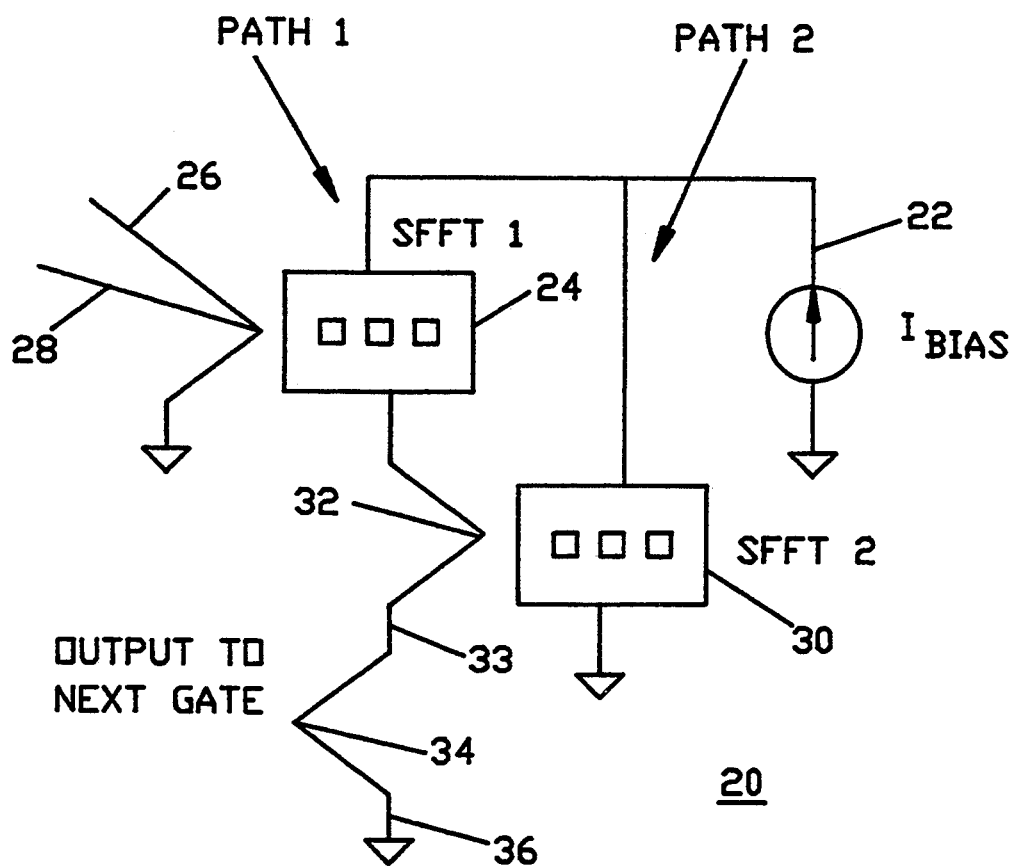
FIG. 3 is a schematic diagram of an SFFT invertor/NOR gate.

While the device characteristics shown in FIG. 2 suggest some inversion behavior if biased correctly, an increase in control current causes a terminal voltage increase and a lower output current resulting in rather "soft" characteristics. In order to improve invertor characteristics, it was necessary to design a circuit with feedback by using multiple SFFTs. The circuit shown in FIG. 3 is the resulting NOR/invertor logic gate 20. The logic input is one or more control currents 26, 28 coming next to the weak links of first SFFT 24, and the NOR logic output is the presence or absence of bias current flowing through Path 1 and out of SFFT 24 on output line 33. This output current can either be used as a control signal 34 for another gate or an input 36 to output buffers, not shown. If one or more of the inputs 26, 28 to the first SFFT 24 are high, bias current flow in this SFFT will shut off, and the bias current will go through second SFFT 30 instead since there is no high control signal 32 affecting the weak links in this SFFT. This SFFT will then remain in a zero voltage state. The output of SFFT 30 corresponds to the non-inverted input ot SFFT 24. This method of operation of course requires that the total bias current not be much higher than the zero field critical current of either device. When the input control current is low to the first SFFT 24, current will flow through SFFT 24 and act as a control signal 32 for second SFFT 30 and force SFFT 30 into the voltage state. The net result is a circuit with relatively well-defined switched states due to the feedback and with low quiescent power dissipation. The latter effect occurs since, if either SFFT is in the voltage state, it passes virtually no current and has no power loss. Otherwise, if it passes significant current, it is in the zero voltage state, again with no power loss.

This circuit can be made entirely from a single film of high temperature superconductor (HTS) material, but to conserve space, normal metal control lines are used as crossovers. Gates using this construction can be kept to less than 20 $\mu$m by 20 $\mu$m. It is anticipated that with further processing improvements, the areas will be closer to 5 $\mu$m by 5 $\mu$m. Although they make fabrication much easier, the normal metal control lines add resistance (from the lines themselves and from contacts to the HTS) and hence increase power dissipation and degrade margins and circuit performance somewhat.

Figure 4:
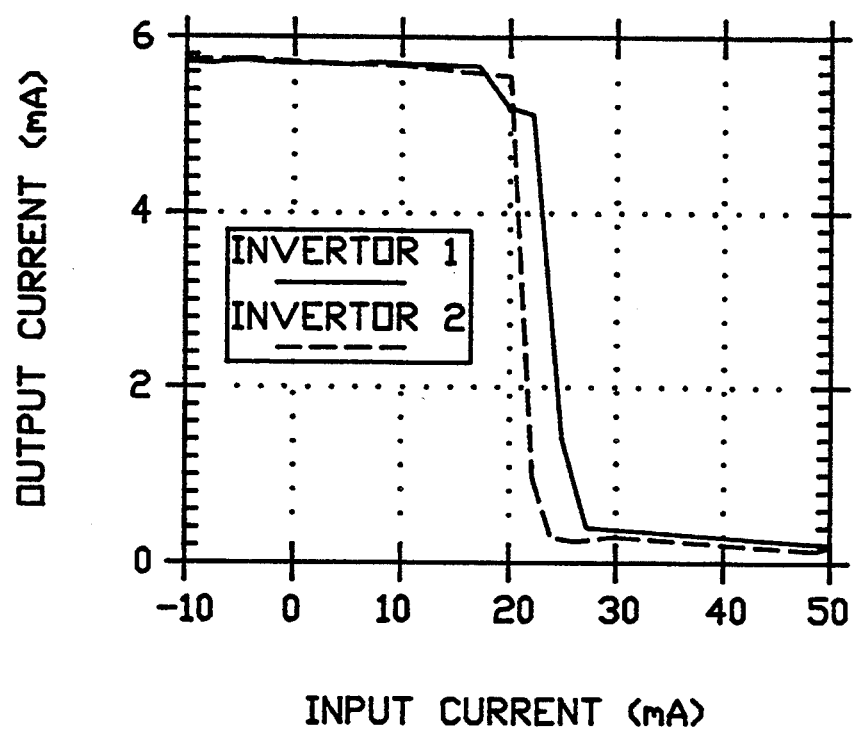
FIG. 4 is a graph showing the transfer curves for the invertor of FIG. 3.

Transfer characteristics of a TlCaBaCuO invertor operated at 77K are shown in FIG. 4. The load in this case is the equivalent of three control lines feeding other SFFTs. It should be noted that the fan-out limitation is the increase in the L/R time constant in the main device path. If normal metal control lines are used, there will be an additional limitation because of path resistance. Simulations indicate that the fan-out will exceed five even for this case. The sharpness of the transition and the large noise margins are clearly evident from FIG. 4. The quiescent power dissipation for this gate is about 20 nW.

The SFFTs used in this circuit had transresistances of about 17 $\Omega$ and output resistances of about 3.5 $\Omega$. These are the critical parameters based on simulations. Input resistance does not greatly affect performance over a range of physically reasonable values. From simulations, the range of acceptable transresistances is about 14 $\Omega$–25 $\Omega$, while the range for output resistances is about 2 $\Omega$–4.5 $\Omega$. Thus the device parameters appear to be fairly loose, and the inventors have fabricated functional SFFT invertors with transresistances form 14.5 Ω–23 Ω and output resistances from 2.5 Ω–4.25 Ω. Since the circuit parameters for these devices are constant over a relatively wide temperature range, invertor operation is also possible over wide temperature ranges. The performance of these gates was virtually the same from about 40K to 90K with TlCaBaCuO invertors. The acceptable range of device parameters changes somewhat at lower temperature because of a significant change in flux dynamics in the TlCaBaCuO system below 30–35K, but these invertors have worked down to 10K. The characteristics of YBaCuO invertors with similar device parameters have been about the same up to about 80K and have worked down to 10K although there is a smooth, small degradation in performance below about 40K as flux speeds decrease and critical fields increase. The YBaCuO has been of a low pinning variety which allowed for fairly high speeds and high transresistances.

Figure 5:
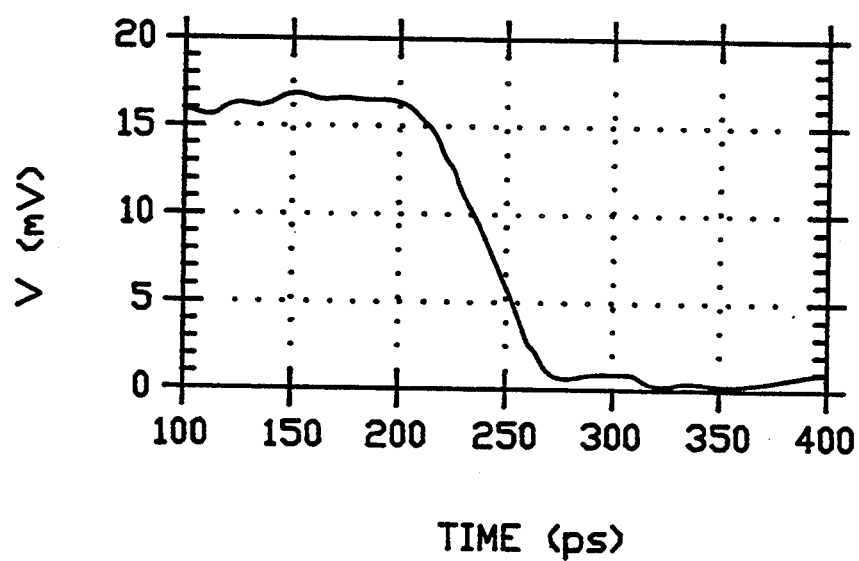
FIG. 5 is a graph showing the transient response of the invertor of FIG. 3.

The speed of the invertor is of great interest, and the measured transient response is shown in FIG. 5 for a TlCaBaCuO invertor at 77K along with the test circuit. The output current of the invertor is used to drive a third SFFT that acts as a transimpedance amplifier so that the sampling oscilloscope can measure the circuit output (the scope cannot measure the output current directly due to signal level mismatch). The input control line and the output SFFT are connected to microstrip transmission lines to perform the measurement. A step is applied to the input control line, and the output is observed on a sampling oscilloscope. The results in FIG. 5 show a fixture-limited rise time of about 51 ps in this case (equivalent loading of 5 gates), and, on a sample of 8 invertors so tested, the rise times have ranged from 49–77 ps. The limiting factor in the time response, aside from fixturing variation, appears to be the L/R time constant in the main inversion loop. Most of the fixturing effects have been removed through calibration of the transmission path without the sample. The circuit characteristics for those invertors made with weakly pinned YBaCuO are quite similar to those of TlCaBaCuO devices, and the transient responses have been very similar as well (60–80 ps rise times).

Figure 6:
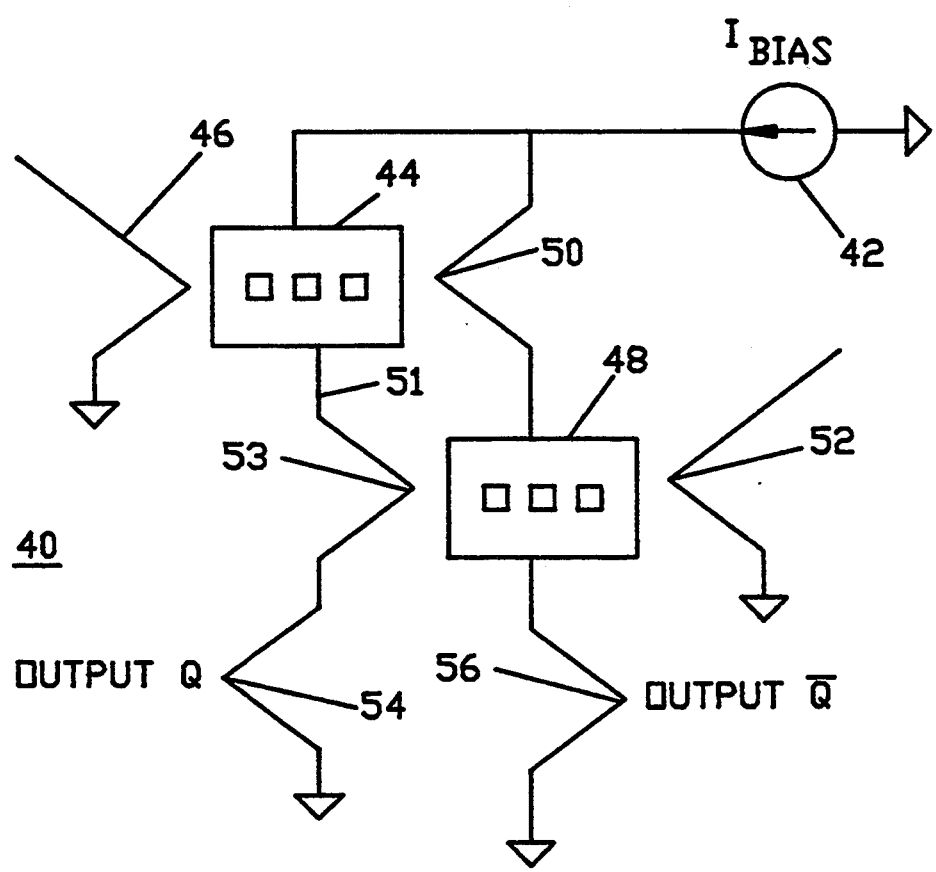
FIG. 6 is a schematic diagram of an SFFT flip flop.

Although two of the NOR gates discussed above could be used as a flip flop, we have designed a two SFFT configuration. This structure is shown in FIG. 6 and is a modification of the inverter discussed above. An additional feedback path has been added to latch the cell, and the control lines have been modified to increase transresistance. Simulation had suggested that higher loop gain (transresistances of a least 20 Ω) would be needed to reliably latch the circuit.

In FIG. 6 the layout of the flip flop can be seen as quite similar to the NOR/inverter gate of FIG. 3. The first SFFT 44 and the second SFFT 48 are both connected to the bias current source 42 as before; however, the bias current input line into second SFFT 48 now has an excursion 50 over to the weak links of the first SFFT 44 to act as an additional control current signal line in addition to the original control current signal line 46 which serves as the logic input to the first SFFT 44. Also a logic input control line 52 has been added to the second SFFT 48. With this layout, a high logic input on line 46 to the first SFFT 44 and a low logic input on line 52 to the second SFFT 48 will produce a high logic output on the output line 56 from the second SFFT 48 with a corresponding low logic output on line 54. A low logic input on line 46 and a high logic input on line 52 will produce a high logic output on line 54 from the first SFFT 44 with a low logic output on line 56. Logic low levels on both inputs 46 and 52 will allow the circuit to retain its current logic state.

Figure 7:
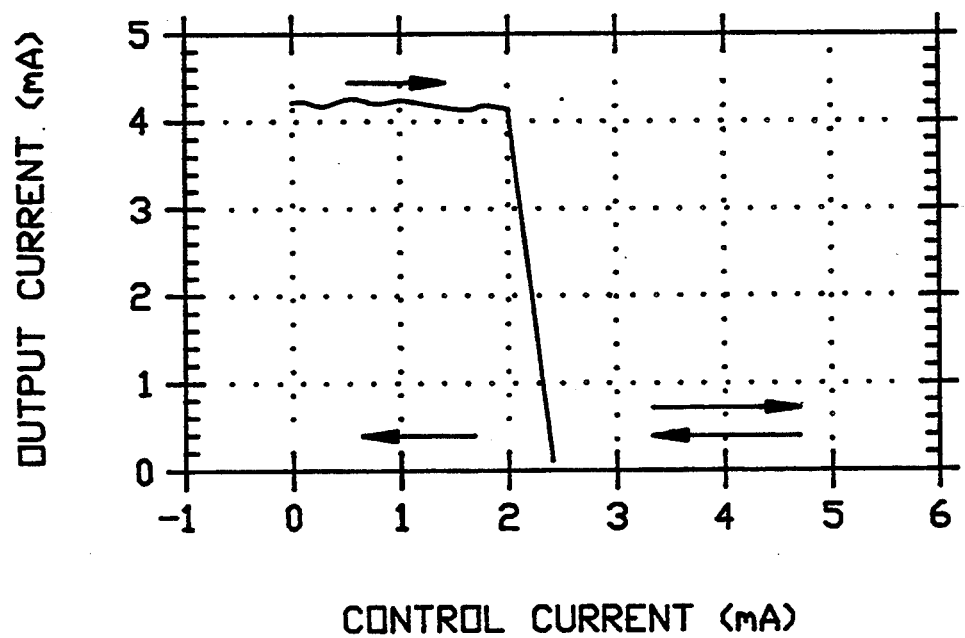
FIG. 7 is a graph showing the low frequency response of the flip flop of FIG. 6 implemented in TlCaBaCuO.

Low frequency test results for the circuit of FIG. 6 are shown in FIG. 7. For this test the circuit started with the current high in the left branch of the circuit and essentially zero current on the other side. Input line 52 was grounded, and the current to line 46 was swept for 0 to 5 mA and back to 0. The arrows on the graph indicate the direction of the transistion/sweep.

Some of the flip flops were made of TlCaBaCuO and tested at 77K. The cell reliably latches and has an effective transresistance of about 22 Ω and output resistance of about 4 Ω. The allowable device parameters on this circuit are somewhat tighter than for the invertor with effective transresistance of 20–26 Ω and output resistance of 2–4 Ω being needed. The TlCaBaCuO flip flops functioned effectively from 40–90K. As with the invertors, the quiescent power dissipation is low, about 30 nW.

Figure 8:
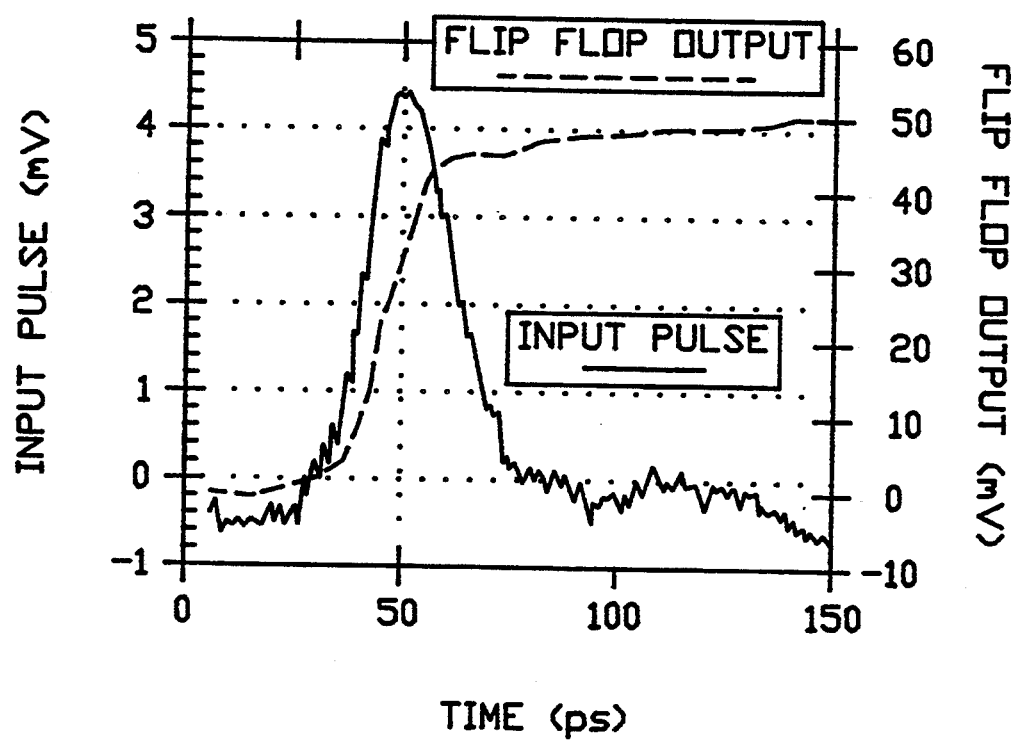
FIG. 8 is a graph showing the transient response of a flip flop of the design of FIG. 6 but implemented in YBaCuo.

YBaCuO flip flops with weakly pinned films have also been fabricated, and the response to a pulse input is shown in FIG. 8. These circuits had bridge widths around 2 μm compared to the 3 μm used with the other circuits. Hence the device speed is somewhat better. Also loop inductance was minimized resulting in smaller loop time constants. As can be seen in FIG. 8, the response time is on the order of 30 ps and is probably fixture limited since 26.5 GHz is the bandwidth of the Cascade signal-ground probes used. The measurement was done in a similar fashion to that described for the invertor transient response, except the input step was sharpened and converted to an impulse using a passive network. A buffer SFFT was again used to provide amplification for the sampling oscilloscope. The input pulse shown here is a stored version of that fed to the device via a power splitter, but the relative timing is accurate to within a few ps by careful path calibration. During this test the flip flop was switched between states because a delayed copy of the input pulse was fed to the second input.

The SFFT can work well as an interface element between Josephson and conventional circuitry. The inputs of these logic circuits are all control lines into which a Josephson junction can easily drive a few mA. The flip flop can take pulses from SFQ circuits and should be able to transfer it to CMOS type logic levels with the addition of a few buffer SFFTs. The output impedance of an SFFT is typically several Ohms and can generally handle a few hundred mV, and they can be arranged in series for higher signal levels. Fully loaded gate speeds with 3 μm lithography is on the order of 40 ps, and it is expected that this can be more than halved with processing improvements. Gate area is currently about 20 by 20 μm with a future expected value of 5 by 5 μm. Flip flops made with 2 μm linewidths have been demonstrated with about 30 ps response time and good noise margins. While the integration levels and speed may not be adequate for some large scale circuitry applications, these gates can fulfill important interface and buffering functions.

We claim:

1. A digital logic circuit comprising:
   means to provide bias current;
   first superconducting flux flow transistor (SFFT) means comprising a main conducting body having a first region, a second region, and an intermediate region comprising at least one weak link of reduced dimensions wherein the first region is connected to the bias current means and wherein an output line is connected to the second region;

a first set of at least one logic input control current lines located proximate to the weak links of the first SFFT;

second SFFT means comprising a first region, a second region, and an intermediate region comprising at least one weak link of reduced dimensions wherein the first region is connected to the bias current means, a section of the output line from the second region of the first SFFT is located proximate to the weak links of the second SFFT, and an output line is connected to the second region; and means to utilize the logic output of the circuit, such means receiving the output from the first current output line from the first SFFT.

2. The circuit of claim 1 wherein the circuit is implemented as a NOR gate with at least two logic input control current lines to the weak links of the first SFFT and the output of the circuit being the output line from the first SFFT.

3. The circuit of claim 1 wherein the circuit is implemented as an invertor with a single logic input control current line to the weak links of the first SFFT and the logic output of the circuit being sensed on the output line from the first SFFT.

4. The circuit of claim 3 wherein the circuit is implemented as a flip flop and further comprising;

a section of the connecting line from the bias current source to the second SFFT being located proximate to the weak links of the first SFFT; and a second set of at least one logic control current lines located proximate to the weak links of the second SFFT;

such that the two output logic states are sensed on the output lines from the first and second SFFTs.

5. The circuit of claim 1 wherein the SFFTs comprise TlCaBaCuO or YBaCuO.

6. The circuit of claim 1 wherein at least one of the logic control lines comprises metal.

7. A digital logic flip flop circuit comprising:

means to provide bias current;

first superconducting flux flow transistor (SFFT) means comprising a first region, a second region, and an intermediate region comprising at least one weak link of reduced dimensions wherein the first region is connected to the bias current means and wherein an output line is connected to the second region;

a first set of at least one logic input control current lines located proximate to the weak links of the first SFFT;

second SFFT means comprising a first region, a second region, and an intermediate region of reduced dimensions comprising at least one weak link wherein the first region is connected to the bias current means, a section of the output line from the second region of the first SFFT is located proximate to the weak links of the second SFFT, a section of the input line to the second SFFT from the bias current means is located proximate to the weak links of the first SFFT, and an output line is connected to the second region of the second SFFT; and a second set of at least one logic control lines located proximate to the weak links of the second SFFT;

such that the two output logic states are sensed on the output lines from the first and second SFFTs.

8. The circuit of claim 7 wherein the SFFTs comprise TlCaBaCuO or YBaCuO.

9. The circuit of claim 7 wherein at least one of the logic control lines comprises metal.

* * * * *